United States Patent
Hou et al.

(10) Patent No.: US 7,467,466 B2
(45) Date of Patent: Dec. 23, 2008

(54) METHOD FOR SEALING A HEAT PIPE

(75) Inventors: Chuen-Shu Hou, Tu Cheng (TW);
Chao-Nien Tung, Tu Cheng (TW);
Tay-Jian Liu, Tu Cheng (TW)

(73) Assignee: Foxconn Technology Co., Ltd.,
Tu-Cheng, Taipei Hsien (TW)

( * ) Notice: Subject to any disclaimer, the term of this patent is extended or adjusted under 35 U.S.C. 154(b) by 76 days.

(21) Appl. No.: 11/308,863

(22) Filed: May 16, 2006

(65) Prior Publication Data

US 2007/0074395 A1    Apr. 5, 2007

(30) Foreign Application Priority Data

Sep. 30, 2005    (CN) .................. 2005 1 0100113

(51) Int. Cl.
*B23P 5/00*    (2006.01)
*B21D 21/00*    (2006.01)
*F28D 15/00*    (2006.01)

(52) U.S. Cl. .................. 29/890.032; 29/890.03; 29/890.053; 29/890.054; 29/505; 165/104.18; 165/104.19; 165/104.21; 165/104.26

(58) Field of Classification Search .............. 29/890.03, 29/890.032, 890.053, 890.054, 505; 165/104.18, 165/104.19, 104.21, 104.26–27, 104.33
See application file for complete search history.

(56) References Cited

U.S. PATENT DOCUMENTS

| | | | | |
|---|---|---|---|---|
| 6,230,407 | B1 * | 5/2001 | Akutsu | 29/890.032 |
| 6,957,691 | B2 * | 10/2005 | Hsieh | 165/104.26 |
| 7,073,257 | B1 * | 7/2006 | Hsu | 29/890.032 |
| 7,192,064 | B2 * | 3/2007 | Hsu | 285/382 |
| 2004/0194311 | A1 * | 10/2004 | Hsu | 29/890.032 |
| 2005/0051259 | A1 * | 3/2005 | Lou | 156/198 |
| 2005/0051301 | A1 * | 3/2005 | Hsu | 165/104.21 |
| 2005/0167984 | A1 | 8/2005 | Hsu | |
| 2006/0117557 | A1 * | 6/2006 | Li | 29/726 |
| 2006/0278383 | A1 * | 12/2006 | Hsu | 165/179 |
| 2006/0283578 | A1 * | 12/2006 | Hsu | 165/104.26 |

FOREIGN PATENT DOCUMENTS

| | | |
|---|---|---|
| CN | 1280290 A | 1/2001 |
| JP | 61-134592 A | 6/1986 |

* cited by examiner

*Primary Examiner*—David P. Bryant
*Assistant Examiner*—Alexander P Taousakis (57) ABSTRACT

A method for sealing a heat pipe, includes the steps of: providing a metallic pipe with an end sealed and an opposite open portion; pressing the open portion of the pipe to form a two layer portion by using two pairs of pressing molds; welding an end part of the two layer portion to form a sealing structure, during which at least one pair of pressing molds continues pressing the two layer portion; and moving the at least one pair of pressing molds away from the sealing structure.

11 Claims, 10 Drawing Sheets

METHOD FOR SEALING A HEAT PIPE

CROSS-REFERENCES TO RELATED APPLICATION

Relevant subject matter is disclosed in a co-pending U.S. patent application Ser. No. 11/308,376, filed on Mar. 20, 2006 and entitled "METHOD AND APPARATUS FOR MAKING HEAT-DISSIPATION DEVICE HAVING VACUUM CHAMBER AND WORKING FLUID THEREIN", which is assigned to the same assignee with this application. The disclosures of the co-pending application are wholly incorporated herein by reference.

FIELD OF THE INVENTION

The present invention relates to a method for sealing a heat pipe.

DESCRIPTION OF RELATED ART

Today, heat pipes are among the chief instruments used to keep electronic components such as central processing units (CPUs) working within a tolerable range of temperature. A heat pipe usually includes a cylindrical body with a cavity defined therein and a quantity of working fluid contained in the cavity. The heat pipes transfer heat originating at the CPUs away through phase transition of the working fluid; the cavities inside the pipes are vacuum-exhausted to form a vacuum thus making the working fluid easy to evaporate. The more perfect the vacuum in the heat pipe, the lower the temperature at which the heat pipe begins to work. Thus, it is necessary for the heat pipe to be hermetically sealed after being vacuum-exhausted, thus forming a sealing structure. The sealing structure of the heat pipe is used for preventing air outside the heat pipe from entering into the heat pipe. Many researchers in this area are looking for a method for sealing a heat pipe, which may keep the pressure in the heat pipe within a certain range.

Figure 8:
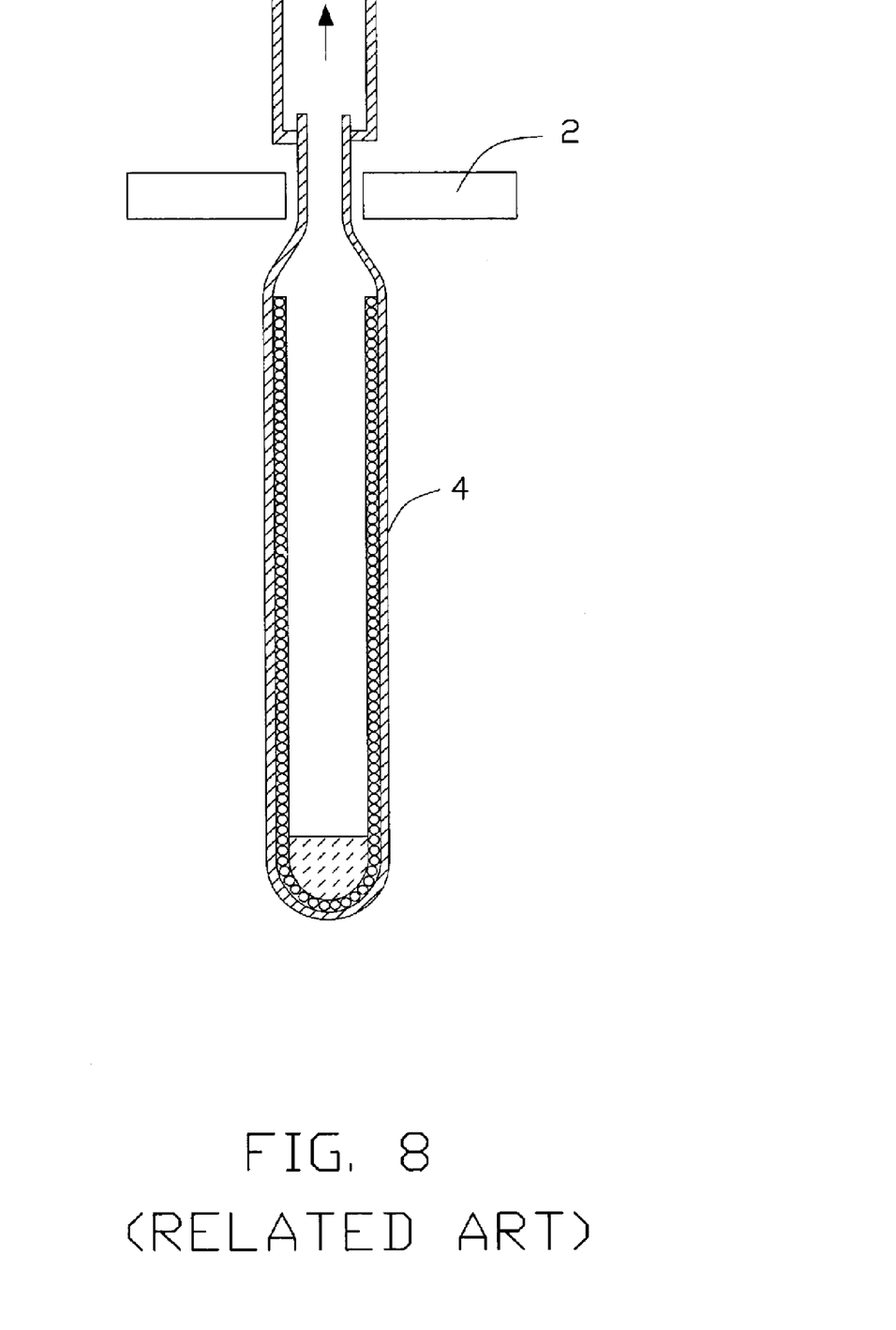
FIG. 8 shows a process used in a conventional method for sealing a heat pipe.
Figure 9:
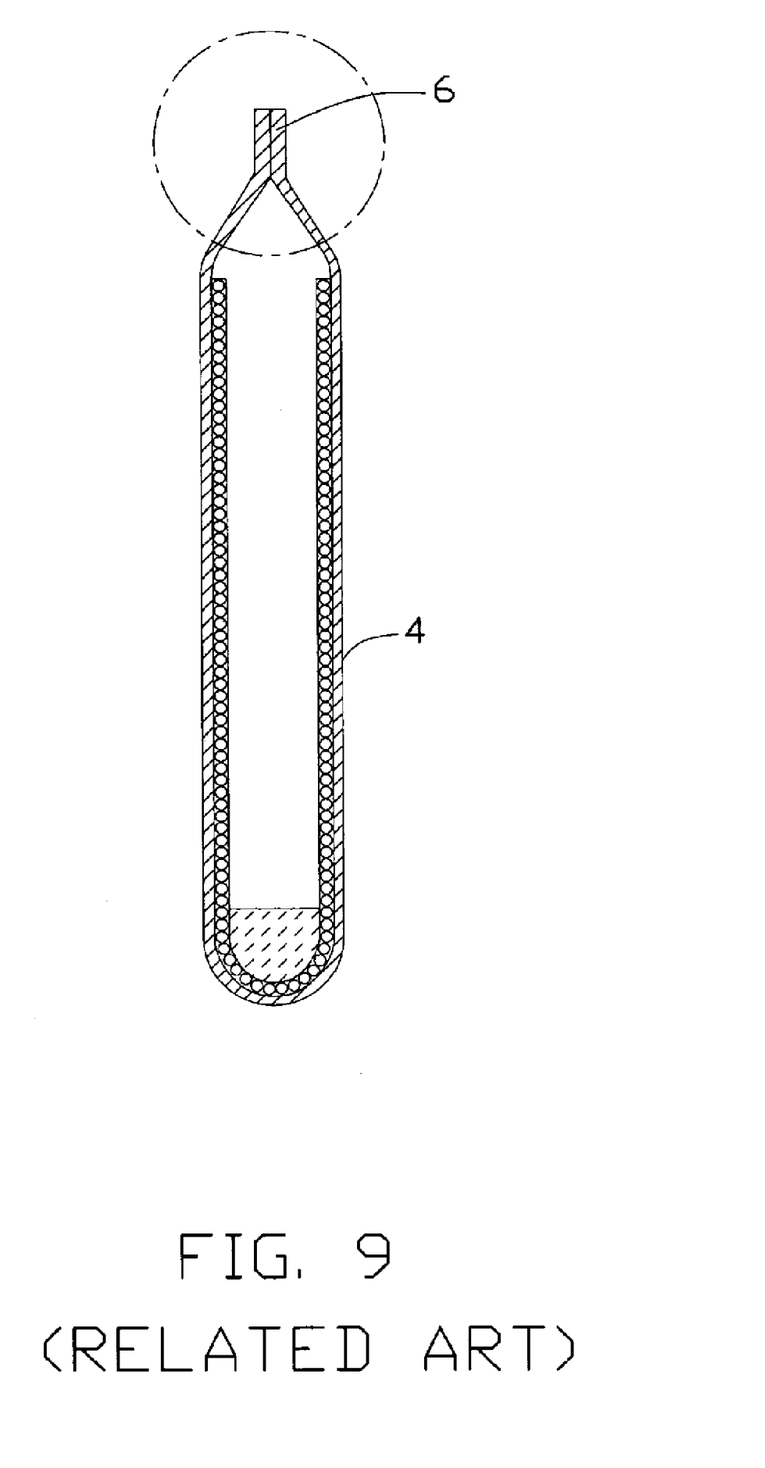
FIG. 9 is a longitudinal-sectional view of a heat pipe manufacture by the conventional method.
Figure 10:
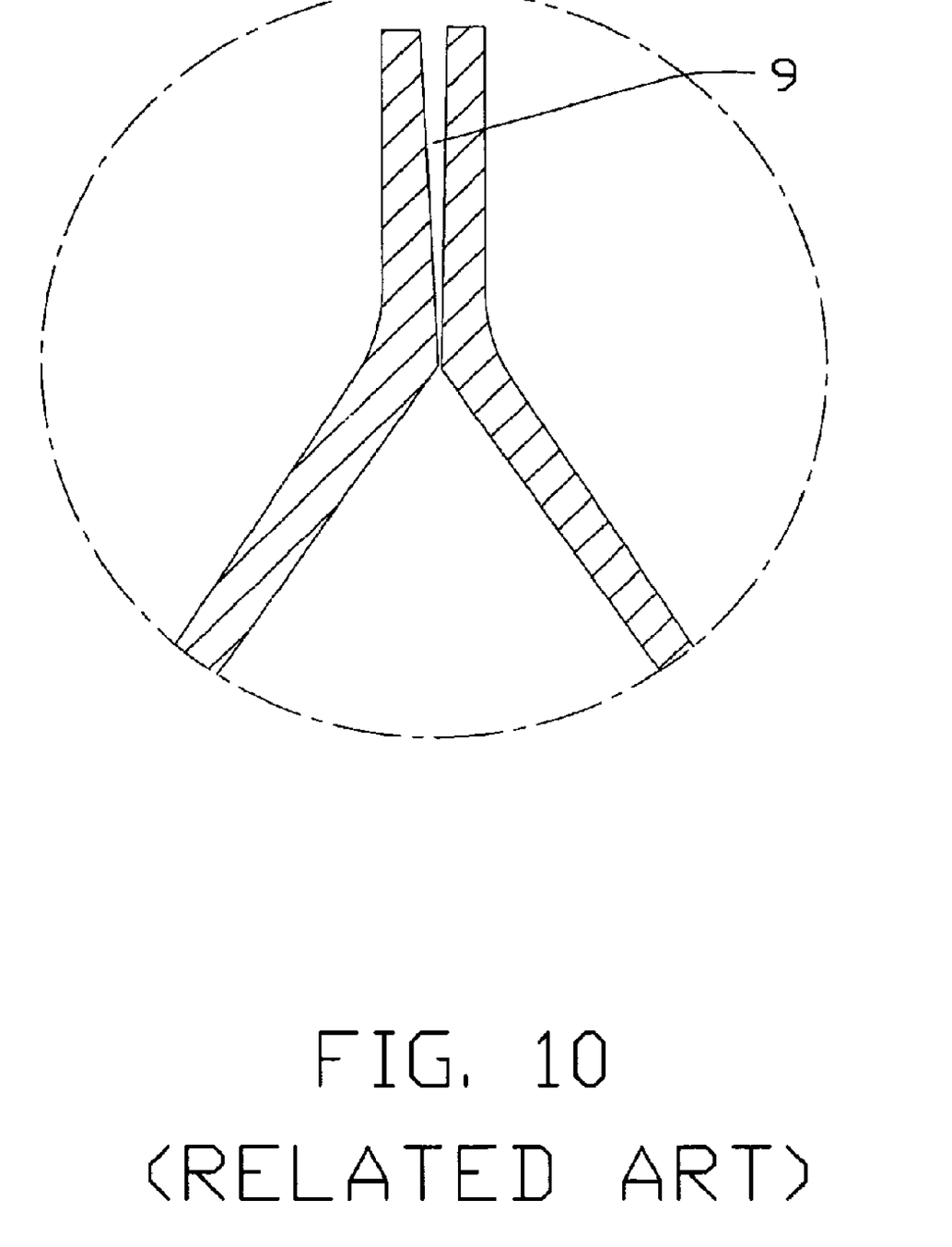
FIG. 10 is an enlarged view of a circled part of the heat pipe of FIG. 9.

A conventional method for sealing a heat pipe is illustrated in FIGS. 8-10. This method includes the following steps.

Step 1: providing a metallic hollow body 4 with an open end portion;

Step 2: pressing the open end portion of the hollow body 4 using a pair of pressing molds 2 to form a flatten end portion 6 closing the open end portion;

Step 3: cutting a top end of the flatten end portion 6 and sealing the heat pipe by using a spot welding device to achieve a two layer sealed structure.

As described above, the sealing structure is of double layers of transformative metal; the metal has flexibility and is prone to resile (i.e. return to its previous form), which may adversely result in tiny slots or pores forming on an interface between the two layers. As shown in FIG. 10, when the two layers of the sealing structure slip past each other, a channel 9 is formed. Although the sealing structure can be further processed by welding, it is difficult to eliminate the channel 9 any longer. Thus, air outside the heat pipe may leak into the heat pipe along the channel 9 and re-pressurize the heat pipe, making the working fluid difficult to evaporate.

What is needed, therefore, is a method for sealing the same, which can overcome the above-described disadvantage of the prior art.

SUMMARY OF THE INVENTION

A method for sealing a heat pipe, comprises the steps of: providing a metallic pipe with an end sealed and an opposite open portion; pressing the open portion of the pipe to form a two layer portion by using two pairs of pressing molds; welding an end part of the two layer portion to form a sealing structure, during which at least one pair of pressing molds continues pressing the two layer portion; and then moving the at least one pair of pressing molds away from the sealing structure.

Other advantages and novel features will become more apparent from the following detailed description of preferred embodiments when taken in conjunction with the accompanying drawings, in which:

BRIEF DESCRIPTION OF THE DRAWINGS

Many aspects of the present method can be better understood with reference to the following drawings. The components in the drawings are not necessarily drawn to scale, the emphasis instead being placed upon clearly illustrating the principles of the present method. Moreover, in the drawings, like reference numerals designate corresponding parts throughout the several views.

DETAILED DESCRIPTION OF THE INVENTION

Figure 1:
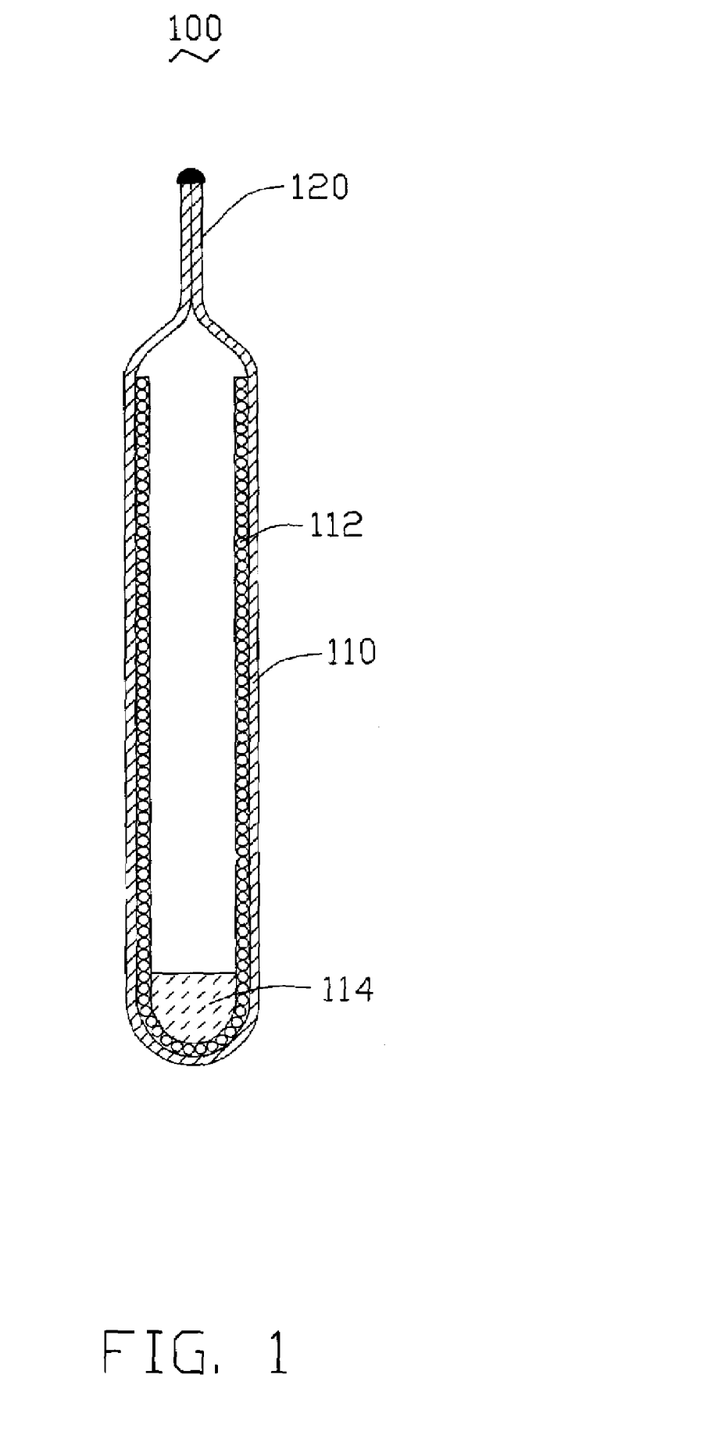
FIG. 1 is a longitudinal-sectional view of a heat pipe with a sealing structure in accordance with a preferred embodiment of the present invention.

Referring to FIG. 1, a heat pipe 100 comprises a metallic body 110, and a wick structure 112 formed on inner surface of the body 110 and saturated with working fluid 114. The heat pipe 100 is vacuum-exhausted to make the working fluid 114 easy to evaporate, and has a sealing structure 120 formed at a top end thereof to maintain a low-pressure vacuum in the heat pipe 100.

A method for forming the sealing structure 120 of the heat pipe 100 in accordance with a preferred embodiment, comprises the following steps.

Figure 2:
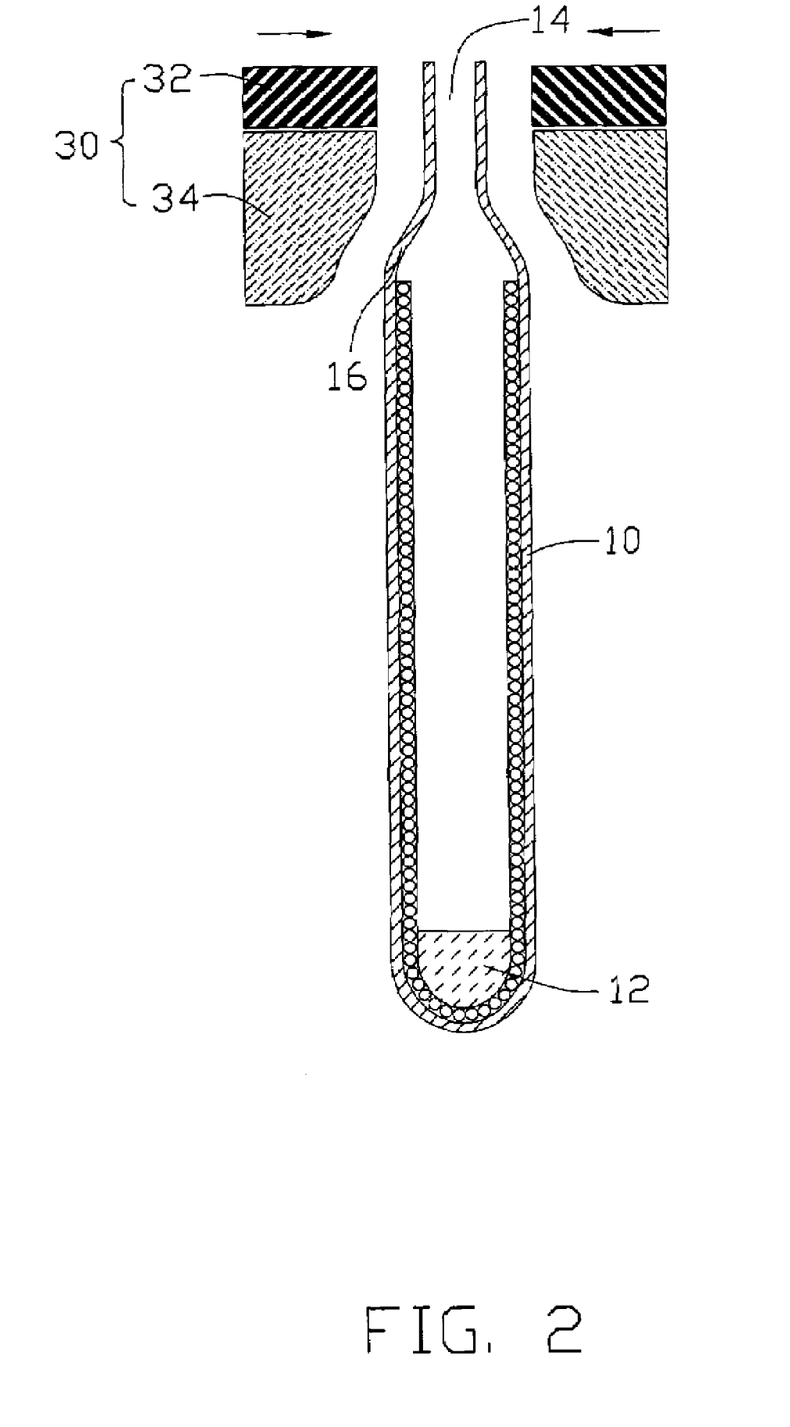
FIG. 2 is a longitudinal-sectional view of a pipe prior to pressing an open end portion thereof by means of two pairs of pressing molds.

Step (1) Providing a metallic hollow pipe 10.

As shown in FIG. 2, the pipe 10 comprises a bottom end sealed and a top open portion 14. A wick structure is formed on an inner surface of the pipe 10 and is saturated with working fluid 12 contained in the pipe 10. Preferably, a shrinkage portion 16 is formed by a shrinking operation and is positioned adjacent to the open portion 14 of the pipe 10.

Figure 3:
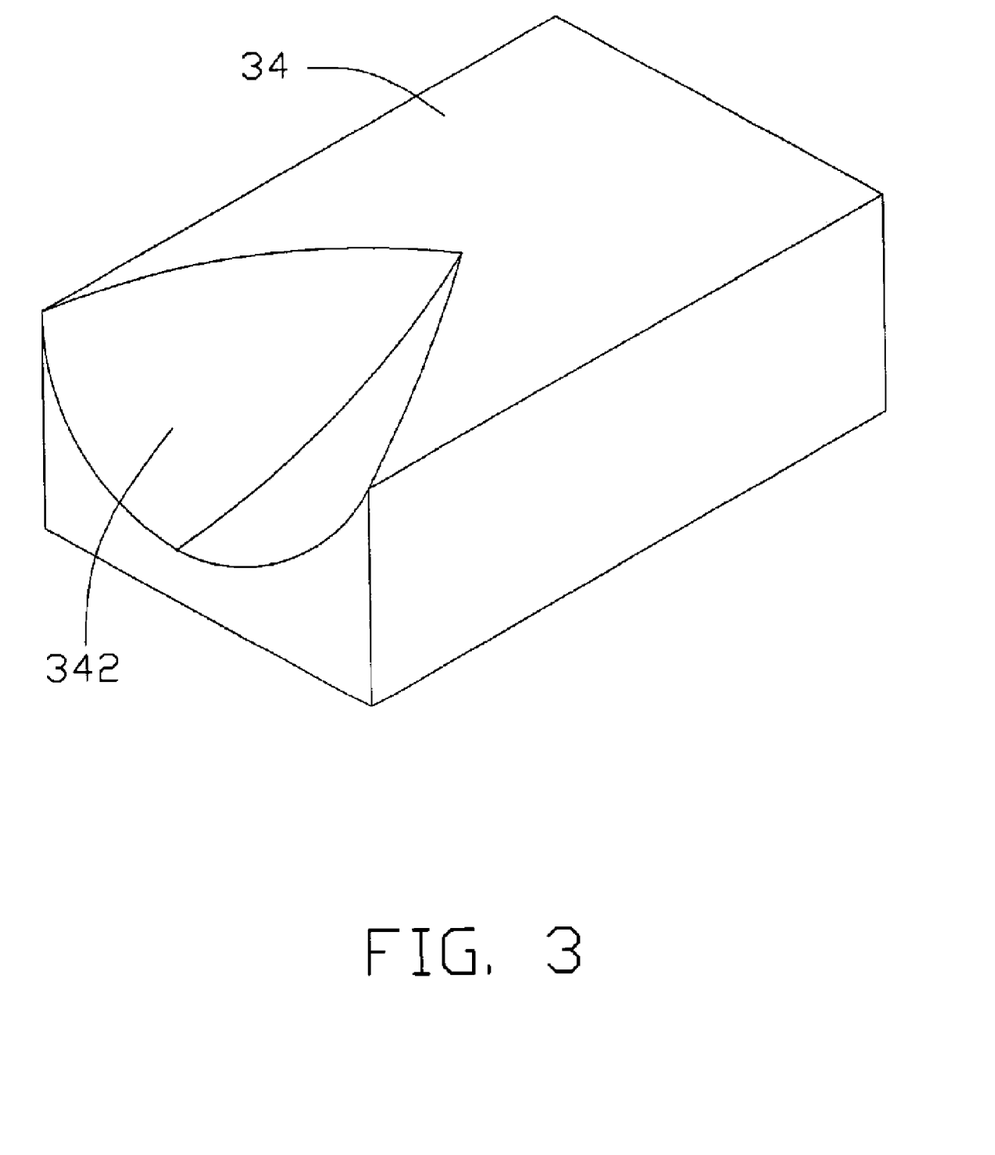
FIG. 3 is a perspective view of a pressing mold of FIG. 2.
Figure 4:
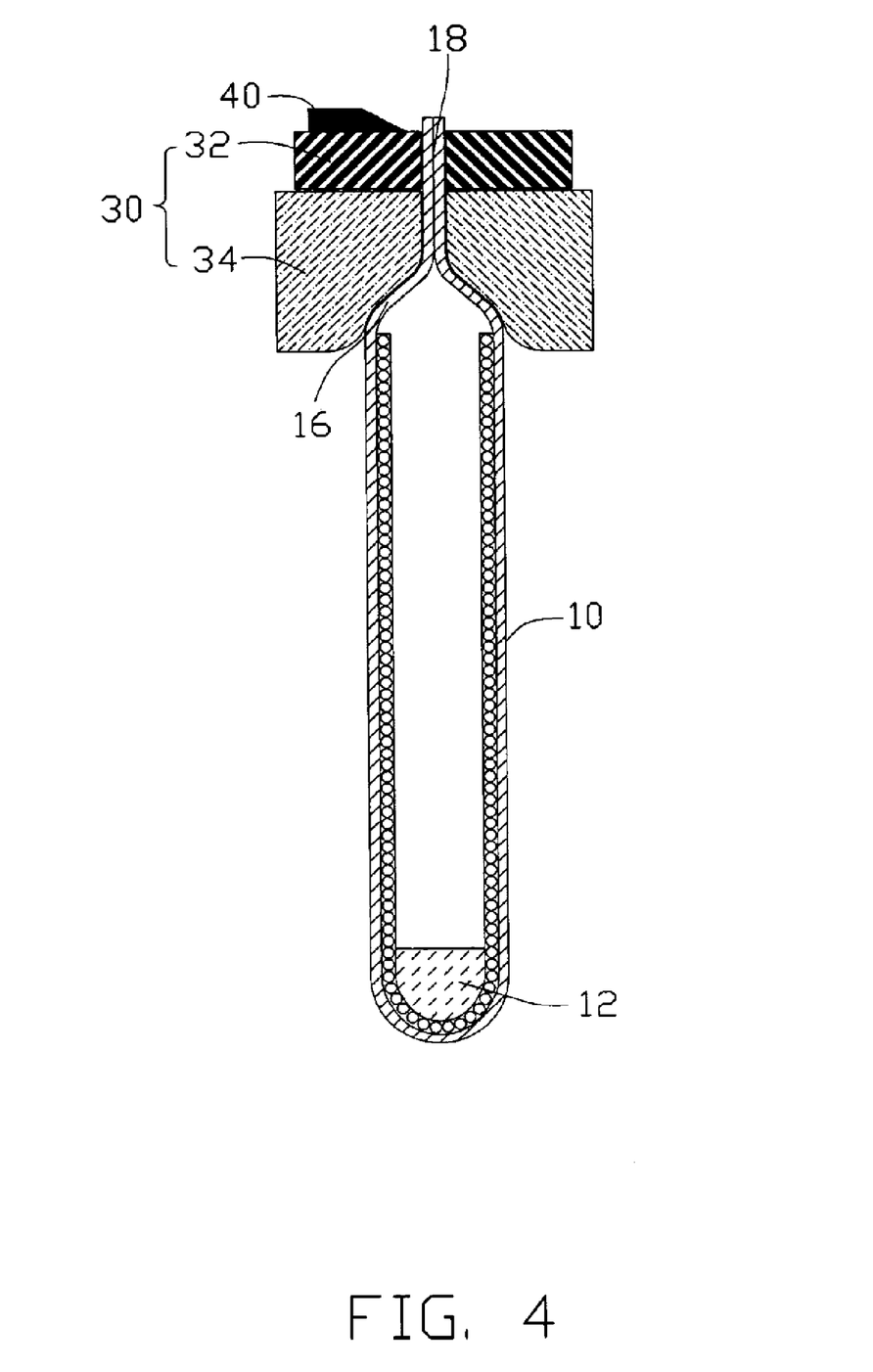
FIG. 4 is a longitudinal-sectional view of the pipe, illustrating the pressing of the open end portion of the pipe by the pressing molds to form a flattened portion and a top end part of the flattened portion prior to being cut off.

Step (2) Transversely pressing the open portion 14 of the pipe 10 to form a flattened portion 18 which constitutes the initial closing of the open portion 14.

As shown in FIGS. 2-5, the open portion 14 of the pipe 10 is disposed in two pairs of pressing molds 30, which include a pair of first pressing molds 32 and a pair of second pressing molds 34 adjacent to and under the first pressing molds 32. Each of the first pressing molds 32 has a flat contacting surface. Each of the second pressing molds 34 has a flat contacting surface and a concave semi-conic contacting surface 342 adjacent to and under the flat contacting surface. The concave semi-conic contacting surfaces 342 of the second pressing molds 34 together encircle the shrinkage portion 16. Therefore, the open portion 14 of the pipe 10 is placed between the first pressing molds 32 and the second pressing molds 34 simultaneously in such a way that the first pressing molds 32 are adjacent to an edge of the open portion 14, the second pressing molds 34 are adjacent to the first pressing molds 32 and the shrinkage portion 16 of the pipe 10. Then, one first pressing mold 32 is moved to press towards the other first pressing mold 32, and with it one second pressing mold 34 is moved to press towards the other second pressing mold 34. One half of the sidewall at the open portion 14 of the pipe 10 is pressed towards the other half of the sidewall. The open portion 14 of the pipe 10 is pressed into the flattened portion 18, that is a two layer portion. After this step (2), the open portion 14 of the pipe 10 is initially closed.

Step (3) using a cutting machine 40 to cut off a part of the flattened portion 18, that is a top end part thereof, which is high above the first pressing molds 32.

Figure 5:
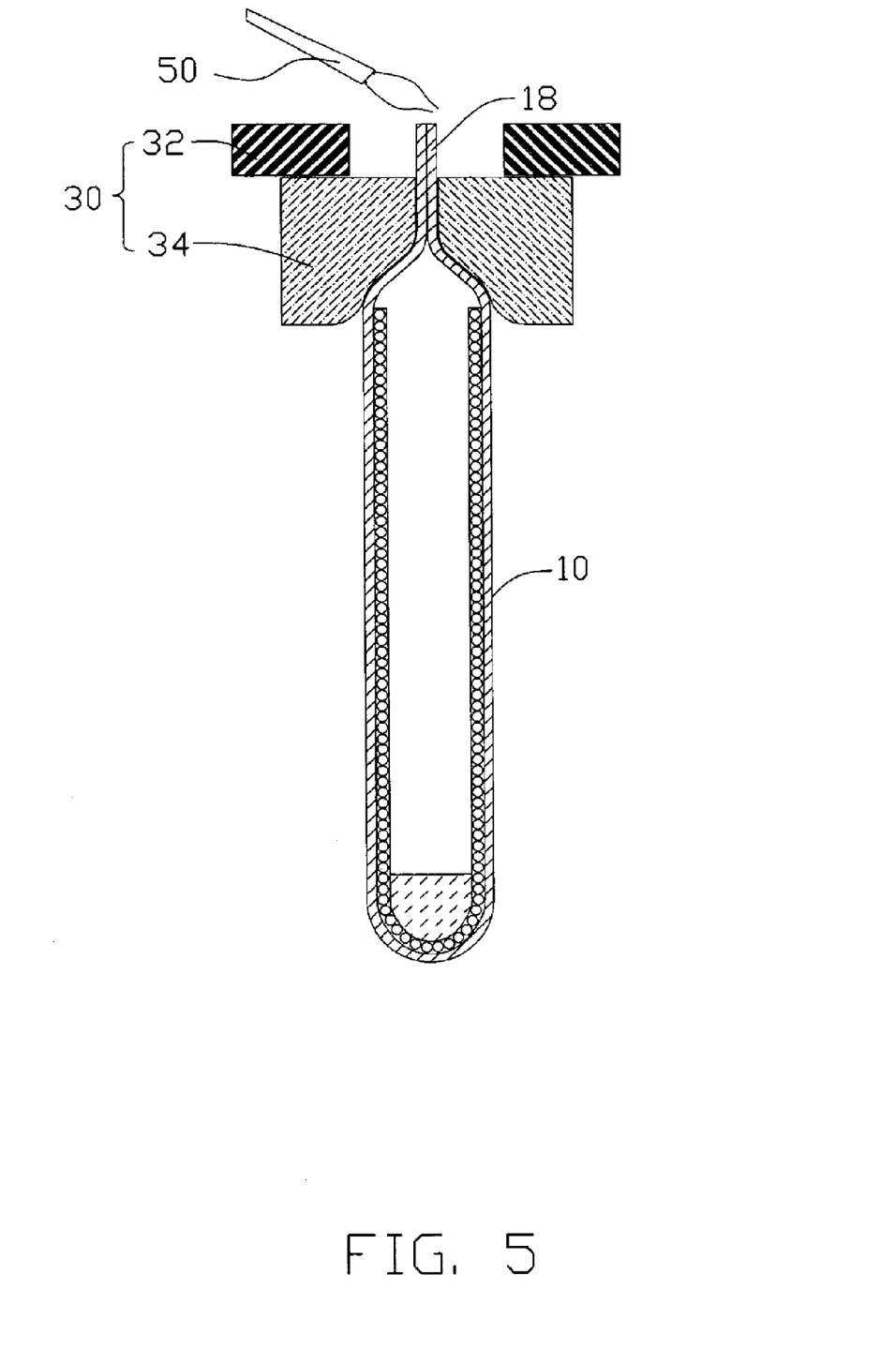
FIG. 5 is a longitudinal-sectional view of the pipe, illustrating the process of sealing the pipe by welding.

Step (4) moving the first pressing molds 32 away from the flattened portion 18, and keeping the second pressing molds 34 tightly pressed against the flattened portion 18 at the same time; thus, the second pressing molds 34 may prevent the layers of the flattened portion 18 from resiling before finishing the next operation of welding.

Step (5) welding a distal part of the flattened portion 18 to form the sealing structure 120, moving the second pressing molds 34 away from the flattened portion 18 after the welding operation. Then, the process of sealing the heat pipe 100 is completely finished. The welding preferably is performed by using an argon arc welding or laser welding to melt the distal part of the flattened portion 18.

As shown in FIG. 1, the sealing structure 120 is of double layers structure of rectangular cross-section since the first pressing molds 32 have flat contacting surfaces. Alternatively, when the first pressing molds 32 have complementary concave and convex contacting surfaces (not shown), a two layer sealing structure with a semicircular-cross section is formed (not shown).

Figure 6:
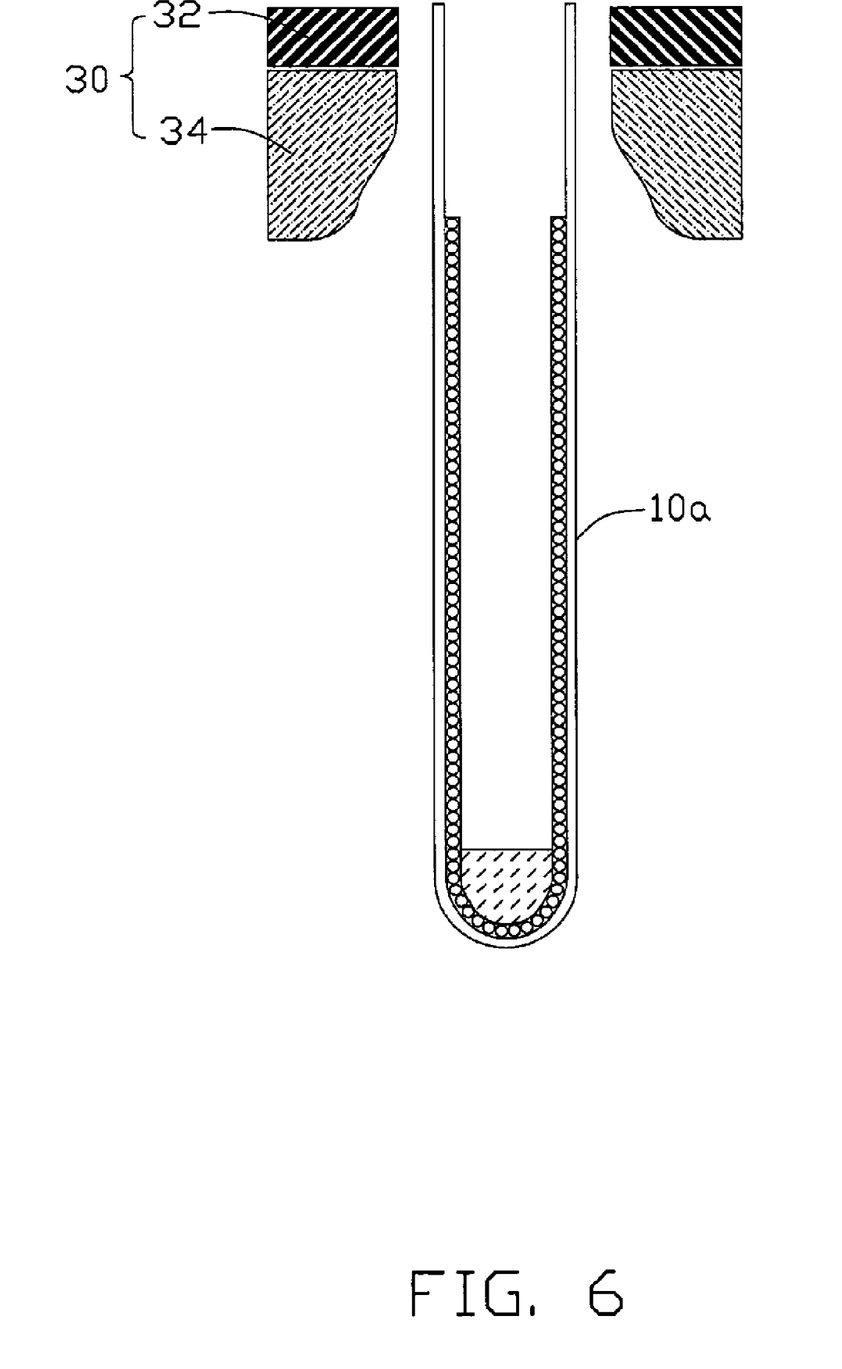
FIG. 6 is a longitudinal-sectional view of another pipe prior to pressing an open end portion thereof by means of two pairs of pressing molds.
Figure 7:
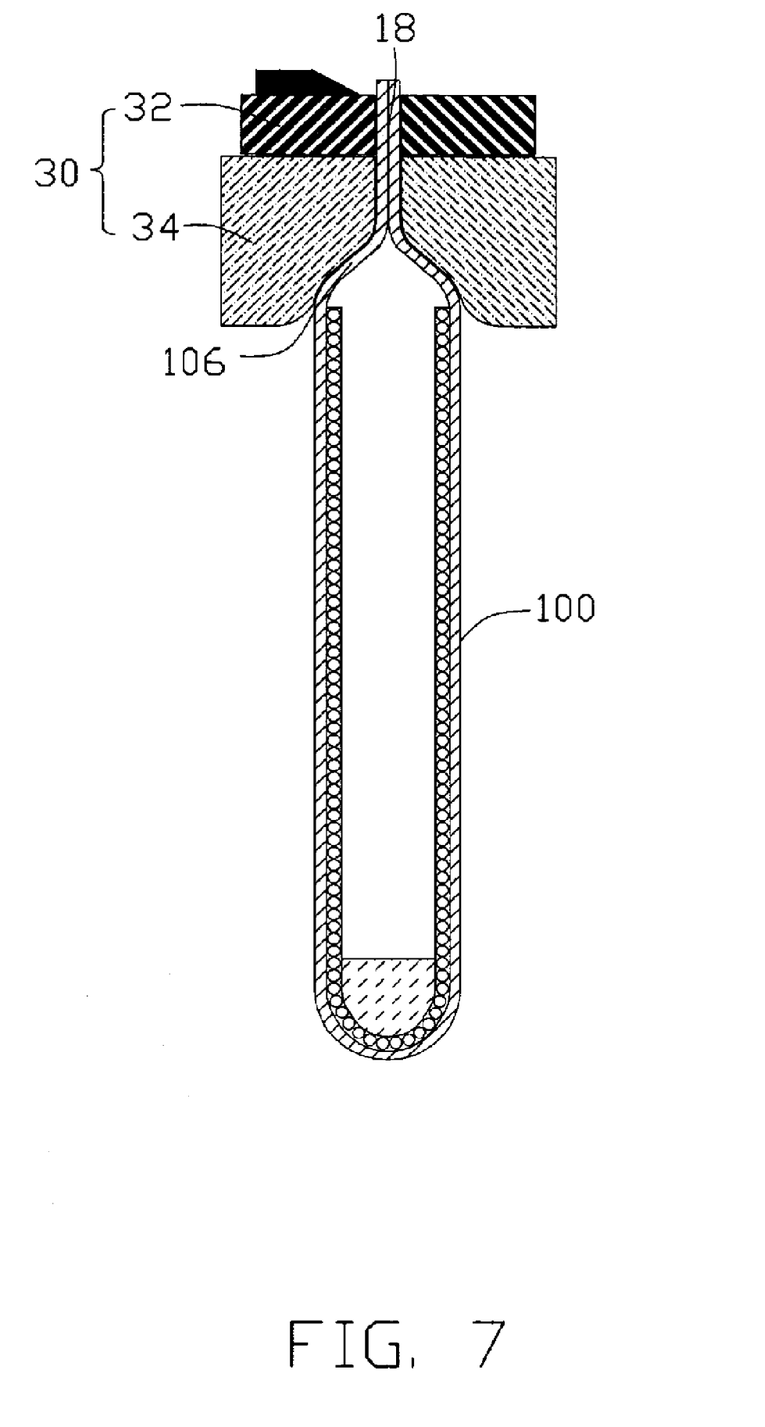
FIG. 7 is similar to FIG. 4, illustrating the pressing of the open end portion of the another pipe by the pressing molds to form a flattened portion and a shrinkage portion synchronously, and a top end part of the flattened portion prior to being cut off.

As shown in FIGS. 6-7, another pipe 10a without a shrinkage portion may be sealed in a similar method to that described above. The main difference is that the concave semi-conic contacting surfaces 342 of the second pressing molds 34 are used to form a shrinkage portion 106 in the pressing operation rather than only to encircle the shrinkage portion 16. Therefore, a shrinkage portion 106 can be formed together with the flattened portion 18, without additional shrinking.

As described above, the method for sealing heat pipes in accordance with preferred embodiments keep the second pressing molds 34 pressing the layers of the flattened portion 18 during the welding operation, which is able to prevent the layers of the flattened portion 18 from resiling before the welding operation is finished. Therefore, the problems of the conventional method can be solved by this method.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for sealing a heat pipe, comprising the steps of:
providing a metallic pipe with an end sealed and an opposite open portion;
pressing the open portion of the pipe to form a two layer portion by using two pairs of pressing molds, wherein the two pairs of pressing molds comprise a pair of first pressing molds and a pair of second pressing molds adjacent to and under the first pressing molds, each of the first pressing molds has a flat contacting surface, and each of the second pressing molds comprises a flat contacting surface and a concave semi-conic contacting surface adjacent to and under the flat contacting surface of the each of the second pressing molds;
welding an end part of the two layer portion to form a sealing structure, during which at least one pair of the pressing molds continues pressing the two layer portion; and
moving the at least one pair of the pressing molds away from the sealing structure.

2. The method as claimed in claim 1, wherein the pipe is a straight pipe, and a shrinkage portion is formed during the pressing operation by the concave semi-conic contacting surfaces of the second pressing molds.

3. The method as claimed in claim 1, wherein the pressing operation comprises a step where the open portion of the pipe is placed between the first pressing molds and the second pressing molds in such a way that the first pressing molds are adjacent to an edge of the open portion, the second pressing molds are adjacent to the first pressing molds and a part of the pipe below the open portion.

4. The method as claimed in claim 1, wherein the first pressing molds have complementary concave and convex contacting surfaces, whereby the two layer portion has a section with a semicircular configuration.

5. The method as claimed in claim 1, further comprising a step where an unnecessary part of the two layer portion is cut off by using a cutting machine before welding.

6. The method as claimed in claim 5, wherein the unnecessary part is a top end part of the two layer portion, which is located above the pressing molds.

7. The method as claimed in claim 1, wherein the welding is performed by applying one of argon arc welding and laser to melt the end part of the two layer portion.

8. A method for forming a heat pipe comprising:
preparing a pipe having a closed bottom end and an open top end, the pipe being vacuum-exhausted and having a wick structure and working liquid therein;
closing the open end by using two pairs of pressing molds clamping the open end thereby to obtain a closed two layer portion, the two pairs of pressing mold including a first pair of pressing molds located above a second pair of pressing molds, and the second pair of pressing molds each including a flat pressing surface and a concave pressing surface below the flat pressing surface;

cutting away a top end of the pipe above the first pair of pressing molds;

moving the first pair of pressing molds away from the heat pipe;

welding a top end of the two layer portion by melting the top end of the two layer portion; and moving the second pair of pressing molds away from the heat pipe.

9. The method as claimed in claim 8, wherein the welding is performed by applying one of argon arc welding and laser welding to the top end of the two layer portion.

10. The method as claimed in claim 8, wherein the pipe has a shrinkage near the open end and the concave contacting surfaces conformably abut against the shrinkage during the closing operation.

11. The method as claimed in claim 8, wherein the pipe is straight and the concave contacting surfaces deform the pipe into a shrinkage during the closing operation.

* * * * *